United States Patent
Bilbao de Mendizabal et al.

(10) Patent No.: US 11,480,631 B2
(45) Date of Patent: Oct. 25, 2022

(54) BRIDGE SENSOR ERROR CHECK

(71) Applicant: Melexis Technologies SA, Bevaix (CH)

(72) Inventors: Javier Bilbao de Mendizabal, Zurich (CH); Mathieu Poezart, Saint-Aubin-Sauges (CH); Gael Close, Morges (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 15/969,053

(22) Filed: May 2, 2018

(65) Prior Publication Data
US 2018/0329000 A1    Nov. 15, 2018

(30) Foreign Application Priority Data
May 9, 2017  (EP) .................................... 17170303

(51) Int. Cl.
*G01R 33/00* (2006.01)
*G01R 33/07* (2006.01)
(Continued)

(52) U.S. Cl.
CPC ......... *G01R 33/0029* (2013.01); *G01D 18/00* (2013.01); *G01L 9/04* (2013.01);
(Continued)

(58) Field of Classification Search
CPC ....................... G01R 33/0029; G01R 33/0035; G01R 33/07; G01R 33/072; G01R 33/075;
(Continued)

(56) References Cited

U.S. PATENT DOCUMENTS

| 6,014,091 A | 1/2000 | Noltemeyer et al. |
| 7,271,595 B2 | 9/2007 | Shimizu et al. |
| (Continued) | | |

FOREIGN PATENT DOCUMENTS

| CN | 102608376 A | 7/2012 |
| CN | 103703382 A | 4/2014 |
| (Continued) | | |

OTHER PUBLICATIONS

Definition of sample, obtained from IEEE 100 The Authoritative Dictionary of IEEE Standards Terms, Seventh Edition, published Dec. 2000 (Year: 2000).*

(Continued)

*Primary Examiner* — Jay Patidar
(74) *Attorney, Agent, or Firm* — Workman Nydegger

(57) ABSTRACT

A method for detecting an error in a bridge sensor which is adapted for measuring a physical parameter. The method comprises biasing a first contact pair of the bridge sensor at least two times in a first direction and at least one time in a second direction opposite to the first direction; while biasing the first contact pair, measuring an output signal on a different contact pair of the bridge sensor, thus obtaining at least three output measurements which are representative for the physical parameter and which are separated by time intervals; combining the output measurements to obtain an output value which is indicative for an error in the bridge sensor, wherein the output measurements which are combined are only those output measurements which are measured when biasing the first contact pair.

20 Claims, 5 Drawing Sheets

(51) Int. Cl.
  *G01L 27/00* (2006.01)
  *G01R 33/09* (2006.01)
  *G01L 9/04* (2006.01)
  *G01D 18/00* (2006.01)
  *G01R 31/28* (2006.01)
  *G01R 17/10* (2006.01)

(52) U.S. Cl.
  CPC .......... *G01L 27/00* (2013.01); *G01R 31/2829* (2013.01); *G01R 33/07* (2013.01); *G01R 33/093* (2013.01); *G01R 33/098* (2013.01); *G01R 17/10* (2013.01)

(58) Field of Classification Search
  CPC .... G01R 33/077; G01R 33/09; G01R 33/091; G01R 33/093; G01R 33/095; G01R 33/096; G01R 33/098; G01R 31/2829; G01R 17/10; G01L 27/00; G01L 9/04; G01D 18/00; G01D 5/142; G01D 5/145; G01D 5/147
  See application file for complete search history.

(56) References Cited

U.S. PATENT DOCUMENTS

| | | | |
|---|---|---|---|
| 9,291,666 B2 | 3/2016 | Ueno et al. | |
| 9,983,274 B2 | 5/2018 | Fatenuma et al. | |
| 10,502,806 B2 | 12/2019 | Motz et al. | |
| 2007/0115005 A1 | 5/2007 | Shimizu et al. | |
| 2014/0159756 A1 | 6/2014 | Ueno et al. | |
| 2014/0210462 A1* | 7/2014 | Yamamoto | G01R 33/07 324/251 |
| 2016/0061912 A1* | 3/2016 | van Vroonhoven | G01R 33/0029 324/225 |
| 2016/0223625 A1 | 8/2016 | Fatenuma et al. | |
| 2016/0252599 A1 | 9/2016 | Motz et al. | |
| 2017/0199252 A1* | 7/2017 | Hioka | G01R 33/07 |
| 2020/0011955 A1 | 1/2020 | Motz et al. | |

FOREIGN PATENT DOCUMENTS

| | | |
|---|---|---|
| CN | 105899964 A | 8/2016 |
| CN | 105929343 A | 9/2016 |
| EP | 1795903 A2 | 6/2007 |
| EP | 3130894 A2 | 2/2017 |
| JP | S593368 A | 1/1984 |
| TW | 200720658 A | 6/2007 |
| WO | 2015067675 A1 | 5/2015 |
| WO | 2016/138597 A1 | 9/2016 |

OTHER PUBLICATIONS

Extended European Search Report from EP Application No. EP 17170303.6, dated Aug. 17, 2017.
Office Action from corresponding CN Application No. 201810430851, dated Jun. 2, 2020.
Proakis et al., "Digital Signal Processing: Principles, Algorithms, and Applications," Prentice-Hall International, Inc., Third Edition, Dec. 31, 1996, 1033 Pages.
"Resistive Bridge Basics: Part Two," Maxim Integrated Products, Inc., Jun. 20, 2005, 12 Pages.
"ZSC31050: Advanced Differential Sensor Signal Conditioner," ZMDI, Revision 1.11, Jul. 31, 2010, 32 Pages.
Fraden, "Handbook of Modern Sensors: Physics, Designs, and Applications; Chapter 6," Springer International Publishing AG, Fifth Edition, Oct. 27, 2015, 80 Pages.
"AS5013: Low Power Integrated Hall IC for Human Interface Applications," ams, Revision 1.15, accessed Jan. 5, 2021, pp. 1-33.

* cited by examiner

BRIDGE SENSOR ERROR CHECK

FIELD OF THE INVENTION

The invention relates to the field of bridge sensors. More specifically it relates to methods and systems for detecting hardware faults in a bridge sensor.

BACKGROUND OF THE INVENTION

Bridge sensors are typically operated by biasing a contact pair and measuring an output signal over another contact pair. The output signal typically is a differential signal which changes because of a change on a resistance value in the bridge sensor. The resistance values in the bridge sensor may change because of the change of a physical parameter. The physical parameter may for example be an external pressure or an external magnetic field.

A bridge sensor can for example be a magnetic sensor which can be used in numerous applications. Many of these applications are safety critical applications such as for example applications in the automotive industry. The correct functioning of these sensors is therefore very important and preferably this can be tested at start-up of the magnetic sensor but also during normal operation of the magnetic sensor.

Hardware faults in a magnetic sensor can for example be detected by dual modular redundancy. In that case the sensor is duplicated. Errors in one of both sensors can then be detected because of the difference in output of both sensors. Such a system is obviously robust but requires duplication of the sensor. In the case of silicon based integrated circuits this results in more silicon surface due to the full redundancy of the readout chain.

There is therefore room for improvement in methods and systems for detecting errors in bridge sensors.

SUMMARY OF THE INVENTION

It is an object of embodiments of the present invention to provide a good method and system for detecting defects in a bridge sensor.

The above objective is accomplished by a method and device according to the present invention.

In a first aspect embodiments of the present invention relate to a method for detecting an error in a bridge sensor which is adapted for measuring a physical parameter. The method comprises: biasing a first contact pair of the bridge sensor at least two times in a first direction and at least one time in a second direction opposite to the first direction; while biasing the first contact pair, measuring an output signal on a different contact pair of the bridge sensor, thus obtaining at least three output measurements which are representative for the physical parameter and which are separated by time intervals; combining the output measurements to obtain an output value which is indicative for an error in the bridge sensor, wherein the output measurements which are combined are only those output measurements which are measured when biasing the first contact pair.

It is an advantage of embodiments of the present invention that only those output measurements are combined which are measured when biasing the first contact pair, and that at least three output measurements are done. The output signal of a bridge sensor comprises a part which is representative for the physical parameter and may comprise an offset part which is independent of the physical parameter. Since the same contact pair is biased, the offset on the output measurements is more similar than if the output signals would be obtained by biasing different contact pairs and hence its impact on the output value can be reduced and hence an output value can be obtained which is more sensitive for errors in the bridge sensor. Moreover, since the same contact pair is biased, the impact of the physical parameter on the output measurements is always the same and hence its impact on the output value can be reduced by combining the output measurements and hence an output value can be obtained which is more sensitive for errors in the bridge sensor and/or less prone for false error detections. Moreover, by measuring at least three times also the impact of variations of the physical parameter on the output value can be reduced and hence an output value can be obtained which is even more sensitive for errors in the bridge sensor and/or less prone for false error detections.

It is an advantage of embodiments of the present invention that three measurements are sufficient to obtain an output signal which is indicative for an error in the bridge sensor and on which changes of the physical parameter have less impact than on the obtained output measurements.

It is an advantage of embodiments of the present invention that differences in offsets which would be present in the output value when biasing different contact pairs are not occurring when biasing always the same contact pair and when only combining the measurements which are obtained when biasing the first contact pair. Thus an output value can be obtained which is less dependent on offset differences and therefore differences caused by errors in the bridge sensor are more easily detectable.

The impact of changes in the physical parameter on the output value can be reduced because at least three output measurements are taken and because these output measurements are taken when biasing the same contact pair. When biasing the same contact pair, the effect of the physical parameter on the output measurements is more similar than when biasing different contact pairs. This has the advantage that higher order deviations are cancelled out more than when using output measurements which are obtained when biasing different contact pairs, and that the resulting output value is less dependent on the first or second order approximations of the bridge sensor. Hence, it is better possible to reduce the impact of the changing physical parameter when biasing always the same contact pair.

It is an advantage of embodiments of the present invention that an error in the hardware which results in a difference in the output value can be detected. Such a difference in the output value may for example be caused by a defect which occurred between the measuring of different output measurements. The hardware faults may for example be occurring in the bridge sensor (e.g. Hall sensor) as well as in the switching network. The error detection can for example be done by checking whether the output value is bound between an upper and a lower threshold value. If not, a hardware error is detected. It is thereby advantageous that the influence of the physical parameter and the offset on the output value is reduced, by taking at least 3 output measurements, by biasing one contact pair in two directions, and by combining the at least 3 output measurements taking into account the time intervals.

In embodiments of the present invention the time intervals between the output measurements are equal.

It is an advantage of embodiments of the present invention that the change of the output measurements caused by a linearly varying physical parameter, between the first two output measurements is the same as the change between the second and the third output measurement. By combining the 3 output measurements the impact of the varying physical parameter on the output value can therefore be reduced.

In embodiments of the present invention changes between consecutive output measurements, which are obtained when biasing the first contact pair, are related to the corresponding time interval between the consecutive output measurements when combining the output measurements.

It is an advantage of embodiments of the present invention that the impact of changes in the output measurements due to a changing physical parameter on the output value can be reduced by relating changes between consecutive output measurements to the corresponding time interval between the consecutive measurements.

In embodiments of the present invention the time intervals between consecutive measurements may be different. In that case the difference between consecutive output measurements caused by the changing physical parameter will be different for the first two measurements than for the second and the third measurement (e.g. in case of a linear varying physical parameter the change will be proportional). By relating these changes to the corresponding time interval it is nevertheless still possible to reduce the impact of the varying physical parameter on the output value.

The time intervals may be predefined time intervals. They may be defined by a user. They may also be adaptively controlled between measurements.

In embodiments of the present invention the measurements of the signal of only one output pair are combined to obtain the output value. In embodiments of the present invention only the output signal of this output pair is measured. This allows to simplify the read-out circuitry.

In embodiments of the present invention the combining comprises obtaining the output value by mathematically combining, e.g. linearly combining the obtained output measurements or changes between the obtained output measurements. In embodiments of the present invention the output measurements or changes between the obtained output measurements are multiplied with a weighing factor and the time intervals are used to calculate the weighing factors. In embodiments of the present invention a first and a third output measurement are measured when biasing the first contact pair in a first direction, and a second output measurement is measured when biasing the first contact pair in a second direction opposite to the first direction. The second output measurement is measured between the first and the third output measurement, and the combining comprises making the sum of the three output measurements wherein the weighing factor of the second output measurement at least comprises a factor 2.

It is an advantage of embodiments of the present invention that 3 output measurements are sufficient to obtain an output value with reduced dependency on a varying physical parameter and on the offsets. This is achieved by using a weighing factor 2 for the second output measurement which is measured when biasing the first contact pair in the opposite direction and which is measured between the first and the third output measurement.

In embodiments of the present invention the bridge sensor is a magnetic sensor.

In embodiments of the present invention the magnetic sensor is a magnetic Hall sensor, or a tunnel magnetoresistance bridge arrangement, or giant magnetoresistance bridge arrangement.

In embodiments of the present invention measuring of the output signal is done by sampling the output signal.

In a second aspect embodiments of the present invention relate to an error detection device for detecting a hardware error in a bridge sensor. The bridge sensor comprises: a sensor element with at least four contacts, a switching circuit arranged such that a first pair of the contacts can be biased in a first direction and in an opposite second direction and such that an output signal of a different pair of the contacts can be measured. The error detection device is adapted for biasing, using the switching circuit, the first contact pair of the bridge sensor at least two times in the first direction and at least one time in the second direction and the error detection device is adapted for measuring, using the switching circuit, an output signal of a contact pair, different from the first contact pair, when biasing the first contact pair, thus obtaining at least three output measurements, which are representative for a physical parameter sensed by the bridge sensor. The error detection device, moreover, is adapted for combining the output measurements to obtain an output value which is indicative for an error in the bridge sensor, wherein the output measurements which are combined are only those output measurements which are measured when biasing the first contact pair.

In embodiments of the present invention the error detection device is adapted for relating changes between consecutive output measurements, which are obtained when biasing the first contact pair, to the corresponding time interval between the consecutive measurements when combining the output measurements.

In a third aspect embodiments of the present invention relate to a sensor for measuring a physical parameter. The sensor comprises: a bridge sensor comprising a sensor element with at least four contacts, an error detection device according to embodiments of the present invention, and an output block adapted for obtaining, based on the obtained output measurements, a field value which is indicative for the physical parameter.

It is an advantage of embodiments of the present invention that hardware faults can be detected even when the sensor is operational. It is moreover advantageous that no extra output signal measurements are required for the error detection device than those which are required for measuring the physical parameter. As no extra measurements are required the error detection device will not limit the bandwidth or response time of the sensor. It is an advantage of embodiments of the present invention that the sensor performances can be preserved even with the presence of the error detection device. The reason therefore being that the error detection device uses output measurements which are used during normal operation of the sensor. The sensor performances comprise the response time, the signal-to-noise level, and the supply current level. Moreover, in embodiments according to the present invention, no extra transistors will be required for measuring the output signals needed for the error detection device.

In embodiments of the present invention the bridge sensor may be a magnetic Hall sensor comprising a Hall element with at least four contacts. Measurements may be done by sampling the output signal. The physical parameter may be the size of a magnetic field wherein the Hall sensor is positioned.

It is an advantage of embodiments of the present invention that it is possible to detect errors in the bridge sensor (e.g. Hall element) or in the connected circuitry without requiring the duplication of the bridge sensor (e.g. Hall element).

It is an advantage of embodiments of the present invention that also in case of a zero magnetic field the error value can be obtained. At 0 B, the Hall voltage will not be zero due to offset and due to biasing of the bridge.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
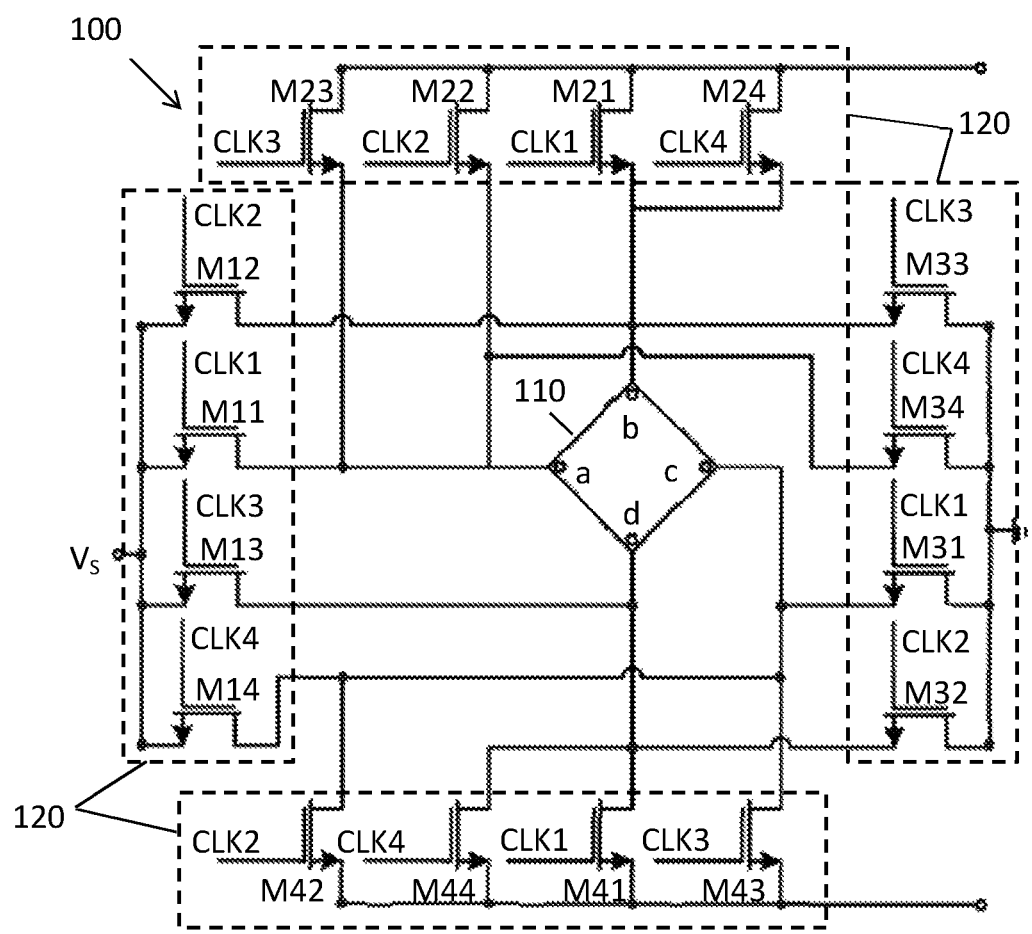
FIG. 1 shows a schematic drawing of a bridge sensor in which an error can be detected using a method and/or a device in accordance with embodiments of the present invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect embodiments of the present invention relate to a method 400 for detecting an error in a bridge sensor 100. The bridge sensor is adapted for measuring a physical parameter such as for example a magnetic field. Such a bridge sensor comprises different contact pairs. For measuring the physical parameter, one contact pair is biased 410 while on another contact pair an output signal is measured which is indicative for the physical parameter. Measuring of the output signal may for example be done by sampling the output signal. This may for example be done at the end of the phase, during which the first contact pair is biased, when the output signal is stable. The invention is, however, not limited thereto. Measuring the output signal may for example also be done by integrating the output signal. The integration may for example be done over a fraction of the phase during which the first contact pair is biased.

The method comprises biasing 410 a first contact pair of the bridge sensor 100 at least two times in a first direction and at least one time in a second direction opposite to the first direction. A current or a voltage may be biased over the first contact pair.

Where in embodiments of the present invention reference is made to biasing of a contact pair in a first direction, reference is made to applying a current or voltage having a first polarity over the contact pair. Where in embodiments of the present invention reference is made to biasing of a contact pair in a second direction opposite to the first direction, reference is made to applying a current or voltage having a second polarity over the contact pair, wherein the second polarity is opposite to the first polarity.

The method moreover comprises measuring 420 an output signal on a different contact pair of the bridge sensor while biasing the first contact pair. The output signal may be a voltage or a current. The output signal may be a digitized output signal. It may be pre-processed (e.g. amplified) before it is digitized. By biasing the first contact pair at least two times in the first direction and at least one time in the second direction at least three output measurements are obtained which are representative for the physical parameter and which are separated by time intervals. The physical parameter may for example be an external magnetic field.

In embodiments of the present invention phase spinning may be applied to the bridge sensor. However, the output measurements which are combined to obtain an output value which is indicative for an error in the bridge sensor are only those output measurements which are measured when biasing the first contact pair.

The method moreover comprises a step combining 430 the output measurements to obtain an output value which is indicative for an error in the bridge sensor. In this step the output measurements which are combined are only those output measurements which are measured when biasing the first contact pair.

Figure 3:
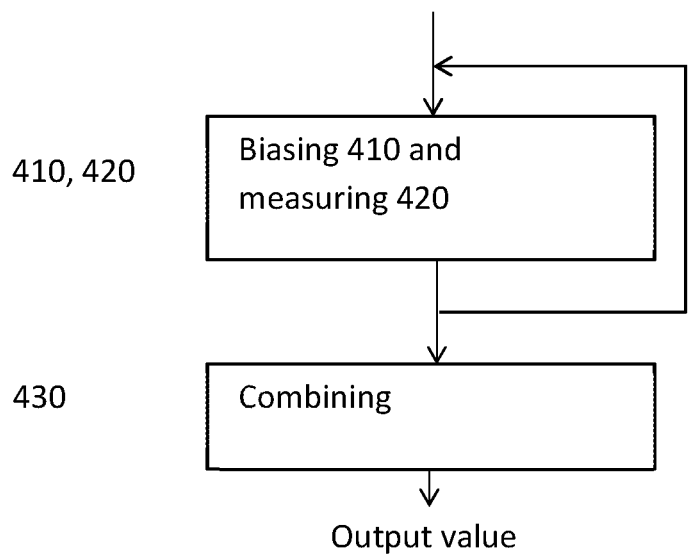
FIG. 3 shows a flow chart of a method in accordance with embodiments of the present invention.

An exemplary embodiment of the method steps in accordance with embodiments of the present invention is illustrated in the flow chart of FIG. 3. First the biasing 410 and measurement 420 steps are repeated until at least 3 output measurements are obtained. Next the output measurements are combined 430 to obtain an output value which is indicative for an error in the bridge sensor.

As will be illustrated below, the influence of the offset and the influence of changes in the physical parameter on the output value can be reduced by combining at least three output measurements which are obtained by biasing the first contact pair of the bridge sensor in accordance with embodiments of the present invention. This has as advantage that the chance for a false error detection is reduced in comparison with existing method where only first order deviations can be corrected.

More details and possible implementations of methods in accordance with embodiments of the present invention will be elaborated in the following paragraphs when also discussing error detection devices in accordance with embodiments of the present invention.

In a second aspect embodiments of the present invention relate to an error detection device 200 for detecting a hardware error in a bridge sensor 100. The bridge sensor can for example be a Hall sensor, a TMR (tunnel magnetoresistance), a GMR (giant magnetoresistance), or a pressure sensor. The bridge sensor comprises a sensor element 110 with at least four contacts.

The bridge sensor moreover comprises a switching circuit 120 arranged such that a first pair of the contacts (e.g. d/b) can be biased in a first direction and in an opposite second direction and such that an output signal of a different pair of the contacts (e.g. a/c) can be measured. Thereby an output measurement can be obtained which is representative for a physical parameter sensed by the bridge sensor 100.

FIG. 1 shows a schematic drawing of a bridge sensor 100 in which an error can be detected using a method and/or a device in accordance with embodiments of the present invention. In this example the bridge sensor 100 is a magnetic Hall sensor and the sensor element 110 is a Hall element. The sensor element comprises four contacts (a, b, c, d). The sensor element may, however, comprise more contacts. The contacts are arranged such that it is possible to bias a first contact pair (e.g. d/b), resulting in a current from one contact of the biased first contact pair, to the other contact of the biased first contact pair, and to select a corresponding second contact pair (e.g. a/c) for measuring an output signal which is representative for a physical parameter. In case of a Hall element this physical parameter is a magnetic field.

FIG. 1 also shows a switching network 120 which comprises a plurality of transistors (M11, M12, M13, M14, M21, M22, M22, M23, M24, M31, M32, M32, M33, M34, M41, M42, M42, M43, M44) which are connected with the contacts on the sensor element 110. By controlling the gates of these transistors it is possible to bias a specific contact pair of the sensor element 110 and to measure an output signal of another contact pair. In a particular embodiment of the present invention, the sensor element bias pairs and readout pairs can be read in a sequential order and repeated over time or randomly. An output value which is indicative for an error in the bridge sensor is obtained by combining output measurements which are measured when biasing a specific contact pair (which may be biased in both directions). The sensor element can be a semiconductor chip. The Hall element can for example be made of different materials such as silicon or GaAs.

The error detection device 200 is adapted for biasing, using the switching circuit 120, the first contact pair (e.g. d/b) of the bridge sensor at least two times in the first direction and at least one time in the second direction.

The error detection device 200 is adapted for biasing, using the switching circuit 120, the first contact pair (e.g. d/b) of the bridge sensor at least two times in the first direction and at least one time in the second direction.

The error detection device 200 moreover is adapted for measuring an output signal of a contact pair (e.g. a/c), different from the first contact pair, when biasing the first contact pair, thus obtaining at least three output measurements. The monitor circuit may therefore make use of the switching circuit 120. The output measurement may for example be a voltage over the contact pair (different from the first contact pair) or a current through the contact pair.

The error detection device 200 may comprise multiplexers to control the switching circuit 120 to bias a contact pair of the sensor element and to control the switching circuit 120 such that an output signal of a different pair of the contacts can be measured. This allows biasing the first contact pair in two directions. Reading out the output signal may each time be done on the same contact pair. When biasing in the opposite direction, it is not required to swap the readout contact pair for measuring the output signal. Inverting the output measurement may in that case be sufficient.

Figure 2:
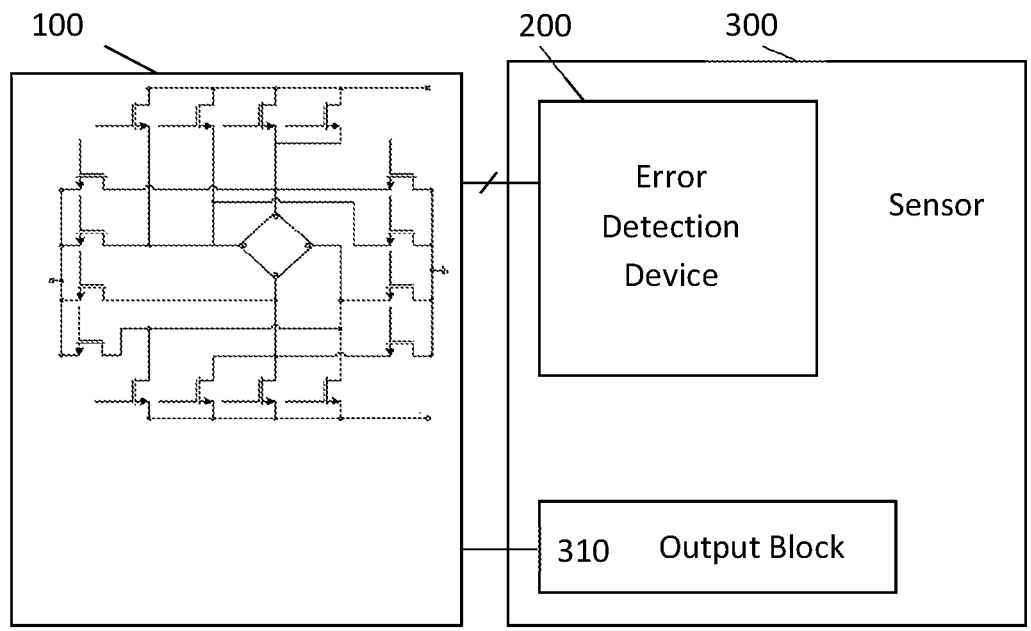
FIG. 2 shows a schematic overview of an error detection device in combination with a bridge sensor in accordance with embodiments of the present invention.

A schematic overview of an error detection device 200 in combination with a bridge sensor 100 in accordance with embodiments of the present invention is shown in FIG. 2.

The error detection device 200 is adapted for combining the output measurements to obtain an output value which is indicative for an error in the bridge sensor 100, wherein the output measurements which are combined are only those output measurements which are measured when biasing the first contact pair.

There may be different hardware errors in the bridge sensor 100. There may be hardware errors in the sensor element 110 itself, there may be errors in the contacts with the sensor element, there may be errors in switching circuitry 120.

Figure 7:
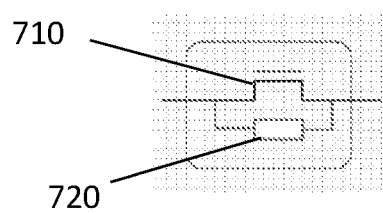
FIG. 7 shows a model of a defect transistor with a parasitic resistive path between the drain and source node.

A possible hardware fault in a bridge sensor could be the failure of a transistor. Hardware defects leading to a parasitic resistive path between the drain and source node of a transistor may be modelled as illustrated in FIG. 7. This parasitic path 720 causes leakages when the transistor 710 is switched off (i.e. when the channel is open).

These leakages may lead to a difference in the output value and may therefore be detected using a device and method in accordance with embodiments of the present invention.

The error detection device according to the present invention can detect any of these errors if the error changes the output value. To detect this change, the error detection device may comprise an upper and/or lower threshold value. As soon as the output value crosses such a threshold value the error detection device may trigger an error signal. In embodiments of the present invention these threshold values may be defined by the design of the bridge sensor, they may be calibrated or they may even be dynamically compensated during operation of the bridge sensor (e.g. to compensate for temperature dependency of the sensor, to compensate for stress, to compensate for voltage and/or current bias). In embodiments of the present invention where the bridge sensor is a magnetic Hall sensor the error thresholds may be computed in units of magnetic field. In embodiments according to embodiments of the present invention the error value may be around zero for a sensor which is not defect.

Figure 4:
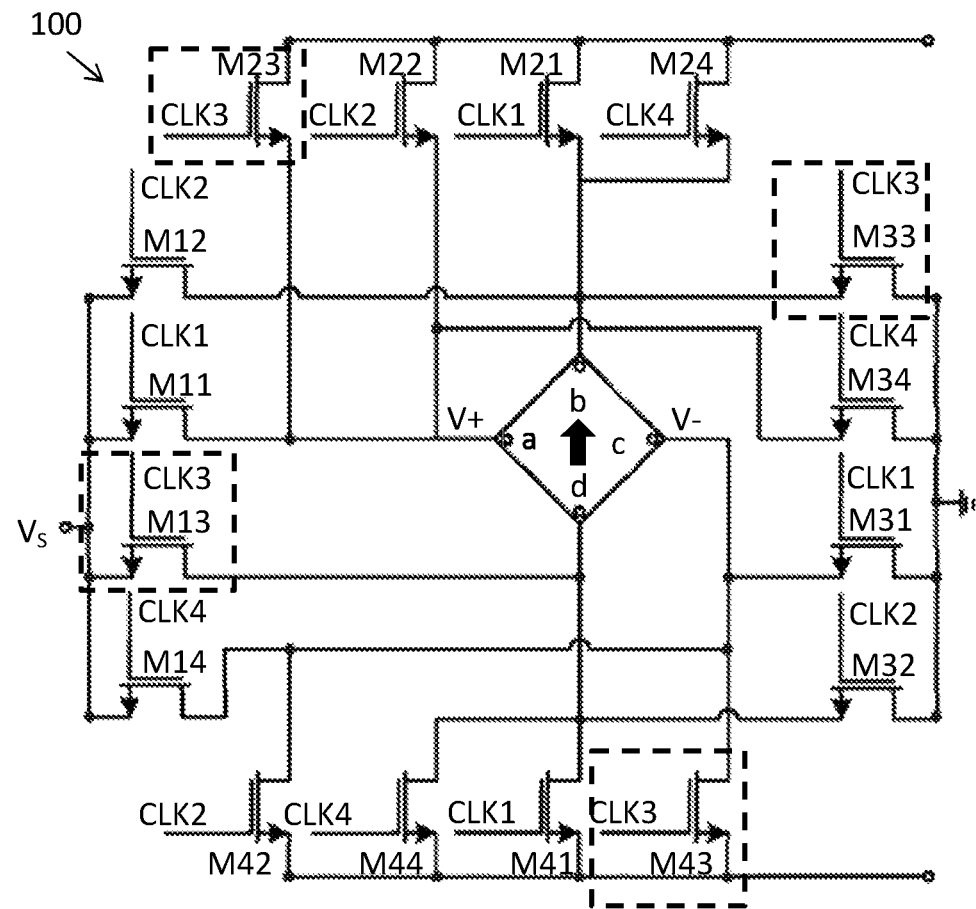
FIG. 4 and FIG. 5 illustrated the biasing of the first contact pair of a bridge sensor.

FIG. 4 illustrates a bridge sensor wherein the transistors M13 and M33 of the biasing circuit 120 are switched such that the first contact pair (db) is biased in a first direction. The transistors M23 and M43 are switched such that an output signal of a different contact pair (ac) can be measured.

Figure 5:
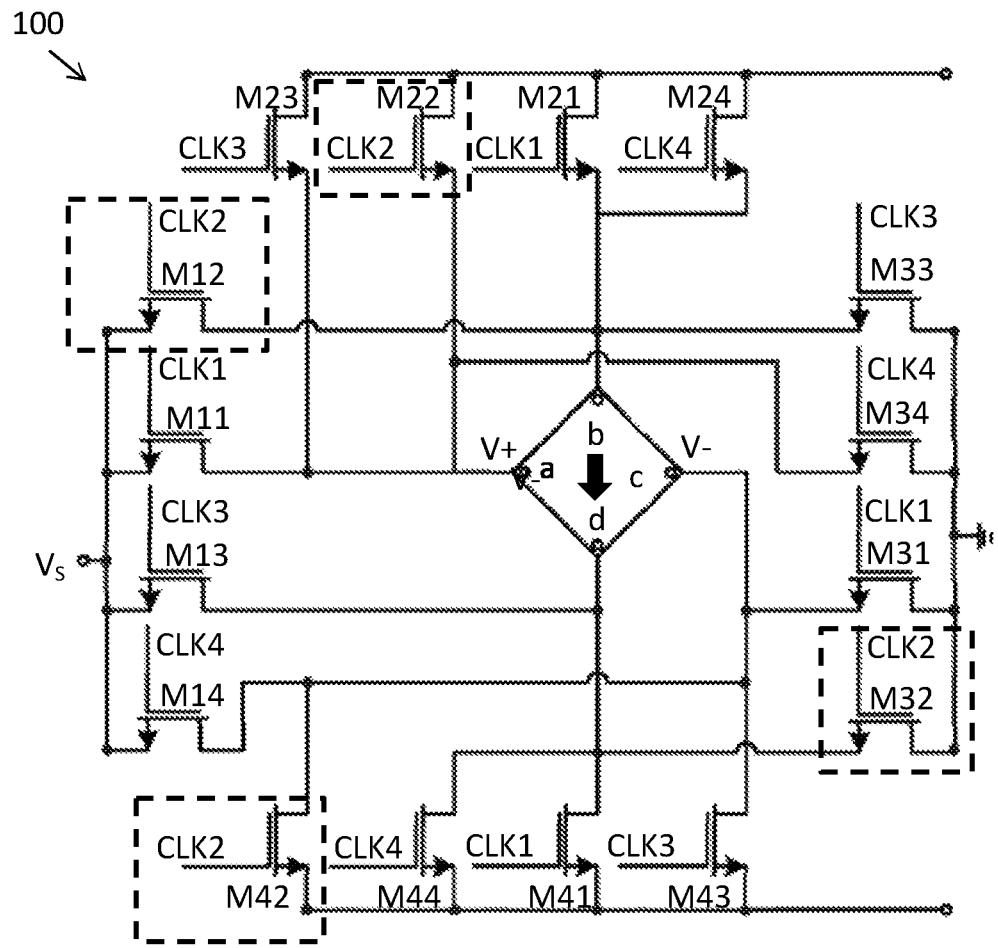

FIG. 5 illustrates a bridge sensor wherein the transistors M12 and M32 of the biasing circuit 120 are switched such that the first contact pair (db) is biased in a second direction opposite to the first direction. The transistors M22 and M42 are switched such that an output signal of a different contact pair (ac) can be measured. In embodiments of the present invention the transistors M23 and M43 may be used for measuring the output signal.

If a fault occurs in one or more of the transistors which are used when biasing in the first direction and doing the corresponding output measurement or when biasing in the second opposite direction and doing the corresponding measurement, this may lead to a change in the obtained output value which is obtained by combining these output measurements.

In case of a magnetic Hall sensor, the output measurement may be a voltage which is dependent on the magnetic field B. In the exemplary embodiment illustrated in the following paragraphs the output measurement is a voltage. This voltage comprises a first term which is dependent on the magnetic field and a second term which is an offset. The offset value may have different causes such as the manufacturing tolerance, mechanical stress and temperature gradients within the sensing element. The offset values in the readout may appear asymmetrically in the different readout configurations.

When biasing a first contact pair of the bridge sensor, at a first time t1, in a first direction the following output measurement may be obtained:

$$\text{Bias}_{bd}: V_{Sense,ac}(t1) = V_{ac}(B(t1),t1) + V_{OFF,ac}$$

When biasing the first contact pair, at a first time t2, in the second direction, and measuring the output voltage over the same contact pair as before, the following output voltage may be obtained:

$$\text{Bias}_{db}: V_{Sense,ac}(t2) = -V_{ac}(B(t2),t2) - V_{OFF,ac}$$

When biasing the first contact pair in the second direction, and measuring the output voltage of the same contact pair but after reversing the contact pair, the following output voltage may be obtained:

$$\text{Bias}_{db}: V_{Sense,ca}(t2) = V_{ca}(B(t2),t2) + V_{OFF,ca}$$

When biasing the first contact pair of the bridge sensor, at a third time t3, in a first direction the following output measurement may be obtained:

$$\text{Bias}_{bd}: V_{Sense,ac}(t3) = V_{ac}(B(t3),t3) + V_{OFF,ac}$$

In the presence of a linearly varying magnetic field, the absolute value of the voltage $V_{ac}$ is linearly increasing. With constant time intervals between t1, t2 and t3 this results in the following output measurements:

$$V_{ac}(B(t2),t2) = -V_{ac}(B(t1),t1) - \Delta V$$

$$V_{ac}(B(t3),t3) = V_{ac}(B(t1),t1) + 2.\Delta V$$

wherein $\Delta V$ is the change of the output measurement over a constant time interval due to the linearly varying magnetic field.

Figure 6:
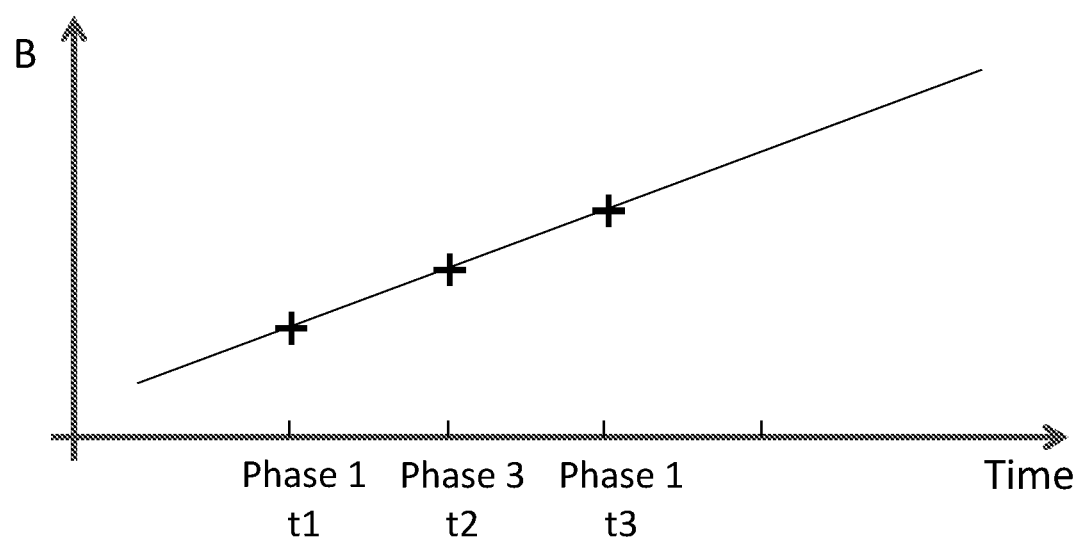
FIG. 6 shows the absolute value of the output measurement when biasing the first contact pair in accordance with embodiments of the present invention.

FIG. 6 shows the absolute value of the output measurement when biasing the first contact pair two times over a first direction (at moments t1 and t3) and one time of the opposite direction (at moment t2) and reading out the voltage over the corresponding second contact pair in the presence of a linearly increasing magnetic field. The X-axis is the time axis and the Y-axis is the voltage axis. The measured voltages are linearly increasing because of the linearly increasing magnetic field.

The graph illustrates the difference between the absolute value of the first measured voltage and the absolute value of the second measured voltage is equal to the difference between the absolute value of the second measured voltage and the absolute value of the third measured voltage. Hence it is possible to obtain an output value which is insensitive to linear changes of the magnetic field.

The output measurements of this example may be combined as follows to obtain an output value which is indicative for an error in the bridge sensor:

$$\text{Output value} = V_{Sense,ac}(t1) + 2.V_{Sense,ac}(t2) + V_{Sense,ac}(t3)$$

In the presence of a linearly varying field and when a constant time interval is present between the measurements this equation can be reformulated as:

$$\text{Output value} = V_{ac}(B(t1),t1) + V_{OFF,ac} + 2.(-V_{ac}(B(t1),t1) - \Delta V - V_{OFF,ac}) + V_{ac}(B(t1),t1) + 2.\Delta V + V_{OFF,ac}$$

As can be seen from this formula the different terms in this formula cancel each other out. This is in the ideal case where the varying magnetic field is linearly varying and where the offsets are identical between the measurements. However, also in the non-ideal case an output value can be obtained which has a reduced dependency on the offset values and on the magnetic field compared to the output measurements.

This reduced dependency can be achieved by biasing always the same contact pair. In that case the difference between the offsets of the different output measurements is smaller than if different input pairs would be biased. Moreover also the effect of the applied field on the output measurements is more similar than when biasing different contact pairs. Additionally the reduced dependency can be achieved by obtaining at least three output measurements which are separated by time intervals.

The time intervals not necessarily need to be equal. By relating changes between output measurements to the corresponding time interval between the output measurements when combining the output measurements an output value can be obtained with a reduced dependency on the varying magnetic field. An example is given below the invention is, however, not limited to this example.

$$V_{ac}(B(t2),t2) = -V_{ac}(B(t1),t1) - \Delta V \cdot \Delta t1$$

$$V_{ac}(B(t3),t3) = V_{ac}(B(t1),t1) + \Delta V \cdot (\Delta t1 + \Delta t2)$$

wherein $\Delta V$ is the change of the output measurement per time unit due to the linearly varying magnetic field.

Hence the following changes can be obtained:

$$V_{Sense, ac}(t1) + V_{Sense, ac}(t2) = -\Delta V \cdot \Delta t1$$

$$V_{Sense, ac}(t2) + V_{Sense, ac}(t3) = \Delta V \cdot \Delta t2$$

By relating these changes to the corresponding time intervals when combining the output measurements the influence of the varying magnetic field on the output value can be reduced. This can for example be done as illustrated in the example below:

$$\text{Output value} = (V_{Sense, ac}(t1) + V_{Sense, ac}(t2))/\Delta t1 + (V_{Sense, ac}(t2) + V_{Sense, ac}(t3))/\Delta t2 = 0$$

An error in the bridge sensor which leads to a change of the output value can for example be detected if this output crosses a threshold value. It is an advantage of embodiments of the present invention that the impact of a varying magnetic field and the impact of the offsets on the output value is reduced as this allows to reduce the threshold value. Reducing the threshold value increases the sensitivity for errors in the bridge sensor but may increase the risk of false error detections. False error detections may occur because of a varying magnetic field. It is an advantage of embodiments of the present invention that the impact of the varying magnetic field on the output value is reduced as this also reduces the chance of false error detections. It is an advantage that this can be achieved by biasing only one contact pair in two directions and by relating the changes between the measurements to corresponding time intervals.

In embodiments of the present invention the output value may be obtained by linearly combining the obtained output measurements or changes between the obtained output measurements wherein the output measurements or changes between the obtained output measurements are multiplied with a weighing factor and wherein the time intervals are used to calculate the weighing factors.

In embodiments of the present invention the time intervals between the measurements may be configurable. It may for example be possible to change the time interval depending on the dynamics of the external magnetic field. The time interval between the output measurements may for example be set shorter than half a period of the highest frequency of the varying physical parameter.

In embodiments of the present invention the first contact pair may be biased more than two times in a first direction and more than one time in a second direction opposite to the first direction. This allows to increase the number of output measurements and to increase the signal to noise ratio for the output value.

In a third aspect, embodiments of the present invention relate to a sensor 300 for measuring a physical parameter. The physical parameter may for example be a magnetic field. The sensor comprises a bridge sensor 100, comprising a sensor element 110 with at least four contacts. The sensor moreover comprises an error detection device 200 in accordance with embodiments of the present invention and an output block 310 adapted for obtaining, based on the obtained output measurements, a field value which is indicative for the physical parameter. A schematic drawing of such a sensor is shown in FIG. 2. The error detection device may comprise means to generate an error bit and/or an error signal based on the obtained output value.

The invention claimed is:

1. A method for detecting an error in a bridge sensor which is adapted for measuring a physical parameter, the method comprising:
   biasing a first contact pair of the bridge sensor at least two times in a first direction and at least one time in a second direction opposite to the first direction,
   while biasing the first contact pair, measuring an output signal on a different contact pair of the bridge sensor wherein measuring of the output signal is done by sampling the output signal, thus obtaining at least three output measurements which are representative for the physical parameter and which are separated by time intervals,
   combining the output measurements to obtain an output value which is indicative for an error in the bridge sensor, wherein the output measurements which are combined are only those output measurements which are measured when biasing the first contact pair.

2. The method according to claim 1, wherein the time intervals between the output measurements are equal.

3. The method according to claim 1, wherein changes between consecutive output measurements of the output measurements, which are obtained when biasing the first contact pair, are related to the corresponding time interval between the consecutive output measurements when combining the output measurements.

4. The method according to claim 1, wherein the bridge sensor is a magnetic sensor.

5. The method according to claim 4, wherein the magnetic sensor is a magnetic Hall sensor.

6. The method according to claim 1, wherein the error detection is done by checking whether the output value is bound between an upper and a lower threshold value.

7. The method according to claim 1, wherein the combining comprises obtaining the output value by linearly combining the obtained output measurements or changes between the obtained output measurements and wherein the output measurements or changes between the obtained output measurements are multiplied with a weighing factor and wherein the time intervals are used to calculate the weighing factors.

8. The method according to claim 7, wherein a first and a third output measurement are measured when biasing the first contact pair in a first direction, and wherein a second output measurement is measured when biasing the first contact pair in a second direction opposite to the first direction, wherein the second output measurement is measured between the first and the third output measurement.

9. The method according to claim 8, wherein the combining comprises making the sum of the three output measurements wherein the weighing factor of the second output measurement at least comprises a factor 2.

10. The method according to claim 1, wherein measuring of the output signal is done by sampling the output signal.

11. The method according to claim 1, wherein measuring the output signal includes measuring a voltage of the output signal.

12. The method according to claim 1, wherein measuring the output signal includes measuring a current of the output signal.

13. The method according to claim 1, wherein the output signal is a digitized output signal.

14. The method according to claim 13, wherein the output signal is pre-processed before it is digitized.

15. The method according to claim 14, wherein preprocessing of the output signal includes amplifying of the output signal.

16. The method according to claim 1, wherein the bridge sensor is a tunnel magnetoresistance bridge arrangement.

17. The method according to claim 1, wherein the bridge sensor is a giant magnetoresistance bridge arrangement.

18. The method according to claim 1, wherein the biasing of the first contact pair includes using a switching circuit.

19. The method according to claim 18, wherein the switching circuit comprises a plurality of transistors that are connected with contacts of a sensor element of the bridge sensor.

20. The method according to claim 1, further includes detecting a hardware error in the bridge sensor based on the output value.

* * * * *